(12) United States Patent
Ge et al.

(10) Patent No.: US 10,056,142 B2
(45) Date of Patent: Aug. 21, 2018

(54) GENERATING A REPRESENTATIVE LOGIC INDICATOR OF GROUPED MEMRISTORS

(71) Applicant: HEWLETT-PACKARD DEVELOPMENT COMPANY, L.P., Houston, TX (US)

(72) Inventors: Ning Ge, Palo Alto, CA (US); Jianhua Yang, Palo Alto, CA (US); Zhiyong Li, Foster City, CA (US); R. Stanley Williams, Portola Valley, CA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/515,317

(22) PCT Filed: Oct. 23, 2014

(86) PCT No.: PCT/US2014/061982
§ 371 (c)(1),
(2) Date: Mar. 29, 2017

(87) PCT Pub. No.: WO2016/064404
PCT Pub. Date: Apr. 28, 2016

(65) Prior Publication Data
US 2017/0229170 A1    Aug. 10, 2017

(51) Int. Cl.
| G11C 15/00 | (2006.01) |
| G11C 13/00 | (2006.01) |
| G11C 7/10 | (2006.01) |
| G11C 15/04 | (2006.01) |

(52) U.S. Cl.
CPC .......... *G11C 13/004* (2013.01); *G11C 7/1006* (2013.01); *G11C 15/046* (2013.01)

(58) Field of Classification Search
CPC .. G11C 13/0007; G11C 15/046; G11C 13/004
USPC ........................................... 365/148
See application file for complete search history.

(56) References Cited

U.S. PATENT DOCUMENTS

| 8,054,662 | B2 * | 11/2011 | Chang ............... | G11C 7/1006 365/148 |
| 8,416,604 | B2 | 4/2013 | Kim et al. | |
| 8,427,203 | B2 | 4/2013 | Pino et al. | |
| 2008/0145951 | A1 | 6/2008 | Folks et al. | |

(Continued)

OTHER PUBLICATIONS

Kannan, S. et al., Secure Memristor-based Main Memory, Jun. 1-5, 2014, DAC 2014, 6 pages.

(Continued)

*Primary Examiner* — Richard Elms
*Assistant Examiner* — Xiaochun L Chen
(74) *Attorney, Agent, or Firm* — HP Inc. Patent Department (57) ABSTRACT

A device for generating a representative logic indicator of grouped memristors is described. The device includes a memristor array. The memristor array includes a number of first memristors having a first set of logic indicators and a number of second memristors having a second set of logic indicators. The second set of logic indicators is different than the first set of logic indicators. Each first memristor is grouped with a corresponding second memristor during a memory read operation to generate a representative logic indicator.

19 Claims, 4 Drawing Sheets

(56) References Cited

U.S. PATENT DOCUMENTS

| | | |
|---|---|---|
| 2009/0163826 A1 | 6/2009 | Mouttet |
| 2009/0196093 A1 | 8/2009 | Happ et al. |
| 2011/0051483 A1* | 3/2011 | Chang .................. G11C 7/1006 365/49.1 |
| 2012/0134200 A1 | 5/2012 | Khoueir et al. |
| 2013/0054886 A1 | 2/2013 | Eshraghian et al. |
| 2013/0100726 A1 | 4/2013 | Wei et al. |
| 2014/0028347 A1 | 1/2014 | Robinett |

OTHER PUBLICATIONS

Manem, H. et al., Design Considerations for Multilevel CMOS/Nano Memristive Memory, Feb. 2012, ACM Journal on Emerging Technologies in Computing Systems, vol. 8, No. 1, Article 6, 22 pages.

* cited by examiner

GENERATING A REPRESENTATIVE LOGIC INDICATOR OF GROUPED MEMRISTORS

BACKGROUND

Memory arrays are used to store data. A memory array may be made up of a number of memory elements. Data may be stored to memory elements by setting values of the memory elements within the memory arrays. For example, the memristors may be set to 0, 1, or combinations thereof to store data in a memristor of a memristor array.

BRIEF DESCRIPTION OF THE DRAWINGS

The accompanying drawings illustrate various examples of the principles described herein and are a part of the specification. The illustrated examples do not limit the scope of the claims.

Throughout the drawings, identical reference numbers designate similar, but not necessarily identical, elements.

DETAILED DESCRIPTION

As described above, memory arrays may be used to store data by setting memory bit values within the memory array. More specifically, a memristor array including a number of memristors may be used to store data by setting memristor resistance levels within the memristor array, each resistance level corresponding to a particular logic level. In using a memristor as an element in a memory circuit, a digital operation is emulated by applying voltage pulses of different polarities to set the memristor to a "low resistance level" which resistance level is associated with a logical level, which may be indicated by a binary value such as "1." Similarly, a voltage pulse of a different polarity, or different value, may set the memristor to a "high resistance level," which resistance level is associated with another logical level, which may be indicated by a binary value such as "0." Different memristors may use different resistance levels to indicate similar logic levels.

A memristor may switch between a low resistance level and a high resistance level during a switching event in which a voltage is applied across the memristor. Each memristor has a switching voltage that refers to a voltage used to switch the resistance level of the memristors. When the supplied voltage is greater than the memristor effective switching threshold voltage, the memristor switches resistance levels. The switching voltage is largely based on the size of the memristor.

Memristors may be used due to their non-volatility, low operational power consumption characteristics, and their compact size. In an example, memristors may be used as one-time programming elements where information is stored in a number of memristors. This may be done by setting a number of memristors to low/high resistance levels. The memristors form a string of ones and zeroes that will store the aforementioned data. If an analog memristor is used, there may be many different resistance states. While memristors may serve as beneficial memory storage devices, their use presents a number of complications.

For example, as described above, each memristor may have a number of resistance values associated with particular logic levels, for example, a first logic level, i.e., a binary "1," could be indicated by a resistance level of 10 kilohms (kΩ) and a second logic level, i.e., a binary "0," could be indicated by 100 kΩ. To replicate these logic levels, a user may simply indicate that any value greater than 50 kΩ represents logic 0 and anything less than 50 kΩ represents logic 1. In other words, in using one level of logic distinction, i.e. 1 and 0, counterfeiters may be able to hijack the memristor array and re-store information on the memristor array. Moreover, as new technologies develop, circuit space is becoming more valuable. Accordingly, it may be desirable for the greater amounts of data storage to occupy less space within a device.

Accordingly, the system and method described herein may alleviate these and other complications. More specifically, the present systems and methods generate a memristor array that increases security by obfuscating the resistance level and logic level relationship as well as increasing the storage density of the memristor array. For example, a memristor array includes a number of memristors. A first portion of the memristors may have one set of logic indicators while a second portion of the memristors may have another set of logic indicators, the sets of logic indicators being different from one another. For example, a first memristor may have a first set of resistance values and a second memristor, combined in parallel with the first memristor, may have a second set of resistance values. The first set of resistance values and the second set of resistance values may be different. A combine engine may use different combinations of the resistance levels of the first memristor and the second memristor to provide a greater number of available resistance levels. With a greater number of resistance levels more logic levels may be indicated by the memristor array. While specific reference is made to combining two memristors, any number of memristors may be combined, for example a first, second, and up to an $n^{th}$ memristor may be combined to increase the number of resistance levels of a memristor array.

To give an example, the first memristor may have two resistance levels and the second memristor may have two other and distinct resistance levels. Without grouping and combining the resistance levels, four total logic levels may be represented by the memristors. These levels may be indicated by their binary equivalents as "00," "01," "10," and "11." By allowing grouping combinations of these memristors, up to eight resistance levels, and eight corresponding logic levels, are indicated by the two memristors as is demonstrated in Table (2) below. The increased number of resistance levels indicates more logical levels can be utilized. Table (2) below indicates these logic levels by their binary equivalents. Accordingly, the storage density of the memristors is increased as well as closer spaced resistance levels. The closer-spaced resistance levels increases the security of the data by making it more difficult to hijack the memristor array.

The present disclosure describes a device for generating a representative logic indicator of grouped memristors. The device includes a memristor array. The memristor array includes a number of first memristors having a first set of logic indicators and a number of second memristors having a second set of logic indicators. The second set of logic indicators is different than the first set of logic indicators. Each first memristor is grouped with a corresponding second memristor during a memory read operation to generate a representative logic indicator.

The present disclosure describes a system for generating a representative logic indicator of grouped memristors. The system includes a memristor array. The memristor array includes a first set of memristors having a first set of logic indicators and a second set of memristors having a second set of logic indicators. The second set of logic indicators is different than the first set of logic indicators. The system also includes a group engine to group a first memristor from the first set with a second memristor from the second set. The system also includes a combine engine to generate a representative logic indicator based on a logic indicator of the first memristor and a logic indicator of the second memristor.

The present disclosure describes a method of generating a representative logic indicator of grouped memristors. The method includes, with a combine engine selecting a first memristor from a first set of memristors and selecting a second memristor from a second set of memristors, in which the second memristor is paired with the first memristor. The method also includes, with a combine engine determining whether to select the first memristor, the second memristor, or a combination of the first memristor and the second memristor and generating a representative logic indicator based on the determination.

As used in the present specification and in the appended claims, the term "memristor" may refer to a passive two-terminal circuit element that maintains a functional relationship between the time integral of current, and the time integral of voltage.

Further, as used in the present specification and in the appended claims, the term "logic indicator" is meant to be understood broadly as any element that indicates a logic level. For example, a resistance level of a memristor may indicate a logic level such as a high logic level and a low logic level. The resistance level may be a logic indicator.

Still further, as used in the present specification and in the appended claims, the term "different" is meant to be understood broadly as indicating that at least one value of a set of values is different from others. For example, a second set of logic indicators being different than a first set of logic indicators is meant to be understood broadly as indicating that at least one of the second set of logic indicators is different than at least one of the first set of logic indicators.

Even further, as used in the present specification and in the appended claims, the term "representative logic indicator" or "representative resistance level" is meant to be understood broadly as a logic indicator or resistance level that is returned to the controller. The representative logic indicator or representative resistance level is based on the logic indicators or resistance levels associated with the various memristors.

Yet further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
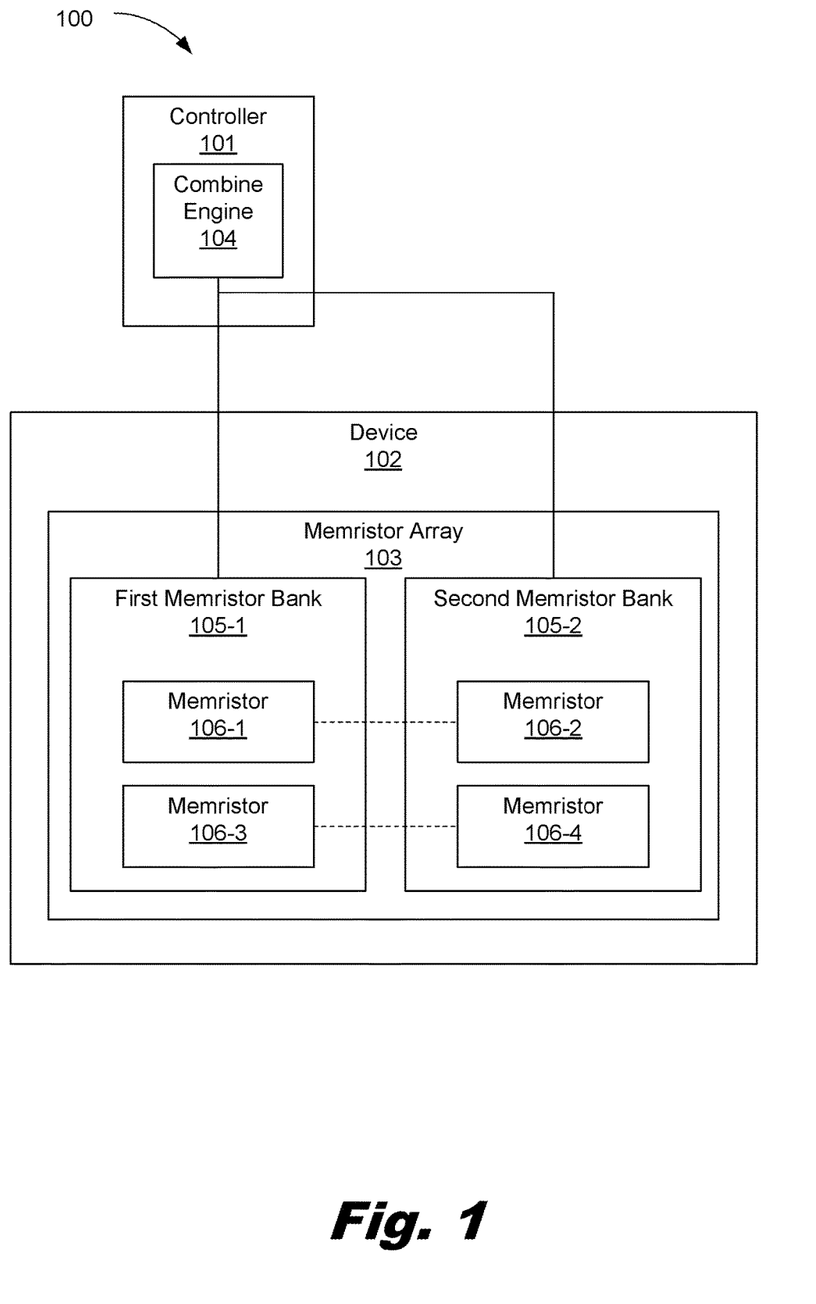
FIG. 1 is a diagram of a system for generating a representative logic indicator of grouped memristors according to one example of the principles described herein.

Turning now to the figures, FIG. 1 is a diagram of a system (100) for generating a representative logic indicator of grouped memristors (106) according to one example of the principles described herein. The system (100) may include a device (102). The device (102) may refer to any element that is used to store memory. The device (102) may include an interface with a controller (101). The interface enables the device (102) to be read, or written to, by the controller (101). The device (102) may be implemented in any electronic device that relies on stored information. For example, the device (102) may be coupled to a server, a laptop, a desktop computer, personal digital assistants (PDAs), mobile devices, smartphones, gaming systems, tablets, printers, a printhead, another type of client device, or any other suitable component that stores information.

The system (100) may include a memristor array (103). A memristor array (103) may be used to store any type of information. Accordingly, a memristor array (103) may be made up of individual memristors (106) to store information. While FIG. 1 depicts four memristors (106-1, 106-2, 106-3, 106-4), the memristor array (103) may include any number of memristors (106).

The memristors (106) store information by representing a logical level to a controller (101). For example, memristors (106) may represent this logical level based on their resistance level. More specifically, a memristor (106) with a high resistance level may represent a logical level of 0 and with a low resistance level may represent a logical level of 1. The number of memristors (106) in a memristor array (103) forms a sequence of 1s and 0s that indicate stored information.

A number of logic indicators may be associated with each memristor (106). A logic indicator may refer to any component that represents a logic level of the associated memristor (106). For example, a memristor (106) may have a number of resistance levels associated with a number of logical levels, the resistance levels being logic indicators. More specifically, in this example, a high resistance level of approximately 100 k$\Omega$ may indicate a logical level of 0 while a low resistance level of approximately 10 k$\Omega$ may indicate a logical level of 1. The resistance levels that correspond to the logical levels may be different between memristors (106). For example, a first memristor (106-1) and a third memristor (106-3) may be memristors that have the above stated resistance levels that indicate the above stated logical levels. In this example, a second memristor (106-2) and a fourth memristor (106-4) may be memristors that have a high resistance level of approximately 200 k$\Omega$ that indicates a logical level of 0 and a low resistance level of approximately 50 k$\Omega$ that indicates a logical level of 1. In other words, the memristor array (103) may have a first number of memristors (106) that have a first set of logic indicators and the memristor array (103) may have a second number of memristors (106) that have a second set of logic indicators. The logic indicators, i.e., resistance levels, of the first number of memristors (106) being different from the logic indicators, i.e., the resistance levels, of the second number of memristors (106).

Each of the first number of memristors (106) having a first set of logical indicators may be grouped with a corresponding memristor (106) of the second number of memristors (106), the second number having a second, and different, set of logical indicators. For example, a first memristor (106-1) with low and high resistance levels of 10 k$\Omega$ and 100 k$\Omega$, respectively, may be grouped in parallel with a second memristor (106-2) having low and high resistance levels of 50 kΩ and 200 kΩ, respectively. By combining the resistance levels of the two memristors (106-1, 106-2), a greater number of resistance levels may be indicated. The greater number of resistance levels thereby indicates that a greater number of logic levels may be represented by the memristor array (103). While specific reference is made to the combination of two memristors, any number of memristors may be combined. For example, the resistance levels of a first memristor (106-1) in a first memristor bank (105), a second memristor (106-2) in a second memristor bank (105-2), and a fifth memristor (not shown) in a third memristor bank (not shown) may be combined as described herein.

In some examples, the memristor array (103) may be divided into a number of memristor banks (105). For example, the memristor array (103) may include a first memristor bank (105-1) and a second memristor bank (105-2). Each memristor bank (105) may include a number of memristors (106). While FIG. 1 depicts two memristor banks (105), the memristor array (103) may include any number of memristor banks (105). As will be described below, the memristors (106) in different memristor banks (105) may be different in terms of switching properties, device materials and stacks. Also, the physical locations of the different memristor banks (105) may also be very different. For instance, the memristor banks (105) may be located on different layers vertically or different dies laterally.

The memristor banks (105) may have a crossbar structure. In a crossbar structure, a number of column electrodes, such as wires, may be oriented in a first direction and a number of row electrodes, such as wires, may be oriented in a second direction that is perpendicular to the column electrodes. In this example, each intersection of each row electrode with a column electrode defines a node that is a memristor (106). In this example, a row electrode or a column electrode may form a bottom electrode of the memristor (106) and the other electrode (i.e., row or column) may form a top electrode of the memristor (106). As memristors (106) are non-volatile, this resistance state is retained even when power is removed from the memristor array (103).

The system (100) may also include a controller (101) to manage the memristor array (103). The controller (101) may include a number of engines to carry out the functionality of generating a representative logic indicator of grouped memristors (106). The engines refer to a combination of hardware and program instructions to cause the controller (101) to implement at least the functionality of generating a representative logic indicator of grouped memristors (106).

For example, the controller (101) may include a combine engine (104) that generates a representative logic indicator. The combine engine (104) refers hardware, program instructions, or combinations thereof used to perform a designated function. The combine engine (104) may include the hardware architecture to retrieve executable code from a data storage device and execute the executable code. The executable code may, when executed by the combine engine (104), cause the combine engine (104) to implement at least the functionality of generating a representative logic indicator for grouped memristors (106), according to the methods of the present specification described herein. In the course of executing code, the combine engine (104) may receive input from and provide output to a number of the remaining hardware units.

The controller (101) may include memory resources that store the program instructions. The program instructions may include a readable storage medium that contains program code to causes tasks to be executed by a processor, such as the controller (101). The readable storage medium may be tangible and/or physical storage medium. The readable storage medium may be any appropriate storage medium that is not a transmission storage medium. A non-exhaustive list of readable storage medium types includes non-volatile memory, volatile memory, random access memory, write only memory, flash memory, electrically erasable program read only memory, or types of memory, or combinations thereof. The controller (101) may be an application specific integrated circuit (ASIC) which reads information from and writes information to the memristor array (103) based on logic indicators of the memristors (106). The ASIC may include a current source and an analog to digital converter (ADC).

The controller (101) may store data such as executable program code that is executed by a processor or other processing device. The data storage device may specifically store computer code representing a number of applications that the processor executes to implement at least the functionality described herein.

A data storage device of the controller (101) may include various types of memory modules, including volatile and nonvolatile memory. For example, the data storage device of the present example includes Random Access Memory (RAM), Read Only Memory (ROM), and Hard Disk Drive (HDD) memory. Many other types of memory may also be utilized, and the present specification contemplates the use of many varying type(s) of memory in the data storage device as may suit a particular application of the principles described herein. In certain examples, different types of memory in the data storage device may be used for different data storage needs. For example, in certain examples the processor may boot from Read Only Memory (ROM), maintain nonvolatile storage in the Hard Disk Drive (HDD) memory, and execute program code stored in Random Access Memory (RAM).

Generally, the data storage device may include a computer readable medium, a computer readable storage medium, or a non-transitory computer readable medium, among others. For example, the data storage device may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

Specifically, the controller (101) may pass at least one control signal to the number of memristors (106). For example, the controller (101) may be coupled to the device (102), via a control line such as an identification line. Via the identification line, the controller (101) may change the resistance level of a number of memristors (106) in a memristor array (103) to effectively store information to a memristor array (103). While specific reference is made to an identification line, the controller (101) may share a number of lines of communication with the device (102), such as data lines, clock lines, and fire lines. For simplicity, in FIG. 1 the different communication lines are indicated by a single line.

Returning to the combine engine (104), the combine engine (104) may generate a representative logic indicator. A representative logic indicator may refer broadly to a logic indicator that is generated based on a logic indicator associated with a first memristor (106) and a logic indicator associated with a corresponding parallel pair of the first memristor (106-1), also referred to as a second memristor (106-2) and other additionally grouped memristors (106). For example, the combine engine (104) may select a first memristor (106-1) and pass the corresponding resistance level. The combine engine (104) may select a second memristor (106-2) and pass the corresponding resistance level. The combine engine (104) may select both the first memristor (106-1) and the second memristor (106-2) and may pass a logic indicator that is representative of the two logic indicators. In this example, the combine engine (104) may select which memristors (106) to select (i.e., the first memristor (106-1), the second memristor (106-2), or both) and may generate a corresponding representative logic indicator based on the selection.

In some examples, as will be described below, the combine engine (104) may determine which memristors (106) or combination of memristors (106) to pass based on a control signal. Using a combine engine (104) to combine a number of memristor (106) logic indicators may be beneficial in that it provides additional density to a memristor array (103). The memristor array (103) as described herein may be beneficial as it increases the storage density of an array by 1) including memristors using different resistance levels to indicate particular logic levels and 2) allowing selection of either or both of grouped memristors. in a representative resistance level that is passed to the controller.

A specific example indicating the increased density using two memristors (106) having different logical indicators is given below. Note that the described values are merely used as an example and should not be used to limit the scope of the specification. Table (1) below describes a number of resistance levels for a number of memristors in the memristor array (103).

TABLE (1)

|  | Low Resistance Level (Ω) | High Resistance Level (Ω) |
| --- | --- | --- |
| Memristor A ($M_A$) | 1,200 | 6,000 |
| Memristor B ($M_B$) | 2,000 | 10,000 |

In this example, each of the memristors (106) may be either in a high resistance level or a low resistance level. Accordingly, without grouping, four logic levels may be represented by $M_A$ and $M_B$. For illustrative purposes, these logic levels may be indicated by their binary equivalents "00," "01," "10," and "11." In other words. By comparison with grouping, additional resistance levels are achieved by selecting to read either 1) the first memristor (106-1) resistance level, 2) the second memristor (106-2) resistance level, or 3) a resistance level representative of both the first and second memristor (106-1, 106-2). Table (2) below indicates the different resistance levels indicated by the memristor (106) pair.

TABLE (2)

| Memristor A ($M_A$) Resistance Level | Memristor B ($M_B$) Resistance Level | Selection | Representative Resistance Level (Ω) | Binary Equivalent |
| --- | --- | --- | --- | --- |
| High (6,000 Ω) | High (10,000 Ω) | $M_B$ | 10,000 | 010 |
| High (6,000 Ω) | High (10,000 Ω) | $M_A$ | 6,000 | 000 |
| High (6,000 Ω) | High (10,000 Ω) | $M_A$ and $M_B$ | 3,750 | 100 |
| High (6,000 Ω) | Low (2,000 Ω) | $M_B$ | 2,000 | 011 |
| High (6,000 Ω) | Low (2,000 Ω) | $M_A$ and $M_B$ | 1,500 | 101 |
| Low (1,200 Ω) | High (10,000 Ω) | $M_A$ | 1,200 | 001 |
| Low (1,200 Ω) | High (10,000 Ω) | $M_A$ and $M_B$ | 1,071 | 110 |
| Low (1,200 Ω) | Low (2,000 Ω) | $M_A$ and $M_B$ | 750 | 111 |

As indicated in Table (2), the grouping of different memristors (106) having different resistance levels allows for more distinct resistance levels and accordingly more logic levels to be indicated by the same number of memristors. In Table (2) each logic level is indicated by its binary equivalent. Thus, the density of a memristor array (103) is increased as more information can be stored using a similar number of memristors (106). Similarly, the combination of the resistance levels increases security as the gap between different resistance levels is smaller, thus decreasing the ability to hijack the memristor array (103).

While FIG. 1 and the specific example described herein illustrate the benefit using two memristors (106), it should be noted that any number of memristors (106) may be used to enhance the effect. For example, a similar table could be constructed based on three, four, or more memristor (106) combinations.

Figure 2:
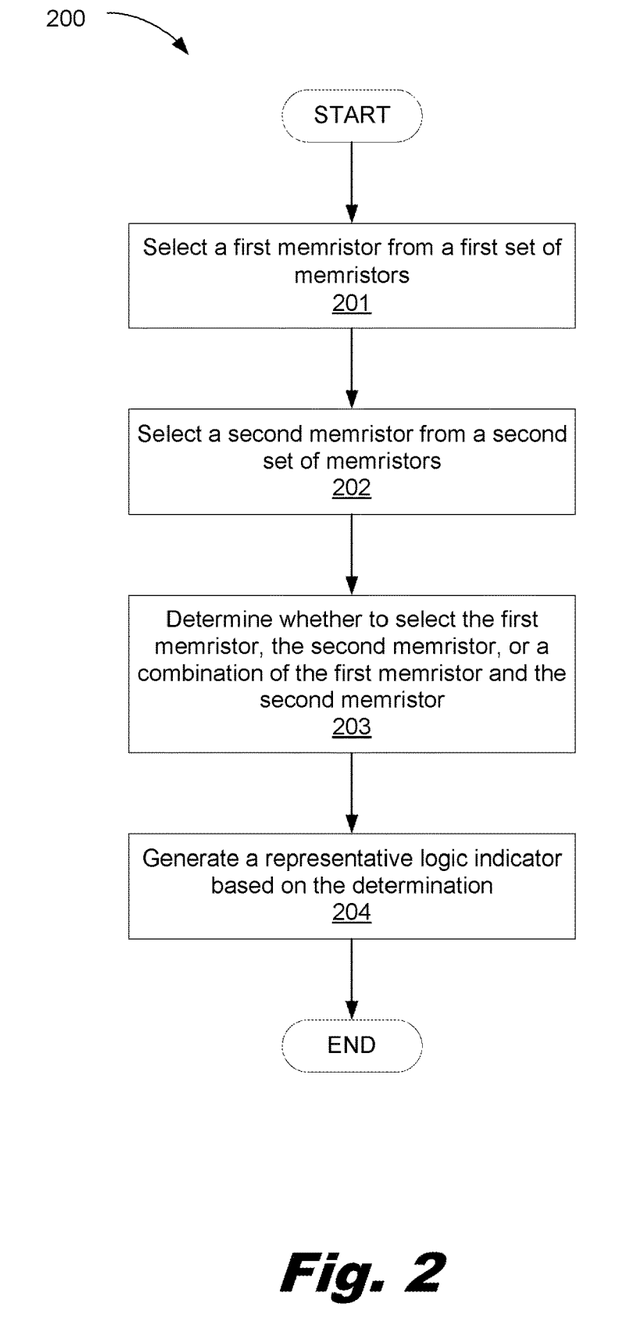
FIG. 2 is a flowchart of a method for generating a representative logic indicator of grouped memristors according to one example of the principles described herein.

FIG. 2 is a flowchart of a method (200) for generating a representative logic indicator of grouped memristors (FIG. 1, 106) according to one example of the principles described herein. The method (200) includes selecting (block 201) a first memristor (FIG. 1, 106-1) from a first set of memristors. The first set of memristors may be memristors (FIG. 1, 106) in a memristor array (FIG. 1, 103) that have a first set of logic indicators, such as a first set of resistance levels that indicate particular logic values. Selecting (block 201) a first memristor (FIG. 1, 106-1) may be based on a control signal received from the controller (FIG. 1, 101).

The method (200) may include selecting (block 202) a second memristor (FIG. 1, 106-2) from a second set of memristors, the second set of memristors being those with a second set of logic indicators that are distinct from the first set of logic indicators. For example, the second set of memristors may have resistance levels that differ at least in part from the resistance levels of the first set of memristors.

In some examples, the selection may be based on a grouping of the second memristor (FIG. 1, 106-2) with the first memristor (FIG. 1, 106-1). For example, as will be described below, memristors (FIG. 1, 106) from the first set of memristors may be paired, in parallel, with memristors (FIG. 1, 106) from the second set of memristors. Accordingly, a control signal from the controller (FIG. 1, 101) may indicate the grouping, or may indicate a single memristor (FIG. 1, 106) from which a second memristor (FIG. 1, 106) is selected based on the grouping. As will be described below, the grouping of memristors (FIG. 1, 106) may be indicated to a group engine. More detail regarding the grouping of memristors (FIG. 1, 106) is given below in connection with FIG. 3.

The method (200) includes determining (block 203) whether to select the first memristor (FIG. 1, 106-1), the second memristor (FIG. 1, 106-2), or a combination of the first memristor (FIG. 1, 106-1) and the second memristor (FIG. 1, 106-2). As described above, when using different memristors (FIG. 1, 106) having different logic indicators, such as different memristors (FIG. 1, 106) having different resistance levels that correspond to logic levels, the ability to select one or both of the memristors (FIG. 1, 106) adds storage density to the memristor array (FIG. 1, 103). Accordingly, the controller (FIG. 1, 101) may determine which combination, or which memristor (FIG. 1, 106) should be selected. In some examples, the determination of whether to select a first memristor (FIG. 1, 106-1), a second memristor (FIG. 1, 106-2), or both may be based on a received control signal from the controller (FIG. 1, 101). For example, the controller (FIG. 1, 101) may indicate that the resistance level of a first memristor (FIG. 1, 106-1) is to be selected, the resistance level of a second memristor (FIG. 1, 106-2) is to be selected, or that a combined resistance level of the first and second memristor (FIG. 1, 106-1, 106-2) is to be selected.

The method (200) includes generating (block 204) a representative logic indicator based on the determination. For example, if it is determined that just the first memristor (FIG. 1, 106-1) is to be selected, the combine engine (FIG. 1, 104) may select the logic indicator of that memristor (FIG. 1, 106-1) and report it as the representative logic indicator. By comparison, if it is determined that just the second memristor (FIG. 1, 106-2) is to be selected, the combine engine (FIG. 1, 104) may select the logic indicator of that memristor (FIG. 1, 106-2) and report it as the representative logic indicator. Yet further, if it is determined that the first memristor (FIG. 1, 106-1) and the second memristor (FIG. 1, 106-2) are to be selected, the combine engine (FIG. 1, 104) may combine the logic indicators of the first and second memristors (FIG. 1, 106-2). A specific example is given as follows.

In this example, a first memristor (FIG. 1, 106-1) may have a low resistance level of 1,200Ω and a high resistance level of 6,000Ω. The second memristor (FIG. 1, 106-2) may have a low resistance level of 2,000Ω and a high resistance level of 10,000Ω. For illustration purposes, the first memristor (FIG. 1, 106-1) is in a low resistance state (1,200Ω) and the second memristor (FIG. 1, 106-2) is in a high resistance state (10,000Ω). In this example, the first memristor (FIG. 1, 106-1) and second memristor (FIG. 1, 106-2) may be selected (blocks 201, 202) based on a grouping. If just the first memristor (FIG. 1, 106-1) is selected, a representative resistance level of 1,200Ω, and a corresponding logic level associated with that resistance level, is returned to the controller (FIG. 1, 101). By comparison, if just the second memristor (FIG. 1, 106-2) is selected, a representative resistance value of 10,000Ω, and a corresponding logic level associated with that resistance level, is returned to the controller (FIG. 1, 101). Still further, if the first memristor (FIG. 1, 106-1) and second memristor (FIG. 1, 106-2) are both selected, the combine engine (FIG. 1, 104) may combine the resistance levels according to the following relationship as the memristors are connected in parallel:

$$R_{tot} = \frac{1}{\frac{1}{R_A} + \frac{1}{R_B}}.$$ Equation (1)

In Equation (1), $R_{tot}$ indicates the total resistance of the two memristors (FIG. 1, 106-1, 106-2) combined. Given this equation, the total resistance level for the first memristor (FIG. 1, 106-1) in the low state and the second memristor (FIG. 1, 106-2) in the high state is 1,071Ω. Accordingly, a representative resistance value of 1,071Ω, and a corresponding logic level associated with that resistance level, is returned to the controller (FIG. 1, 101). An example of other combinations of two memristors (FIG. 1, 106) is given above in Table (2). However, the examples provided are merely examples and any number of resistance levels could be used as well as any number of memristors (FIG. 1, 106) paired for use in generating representative logic indicators.

Figure 3:
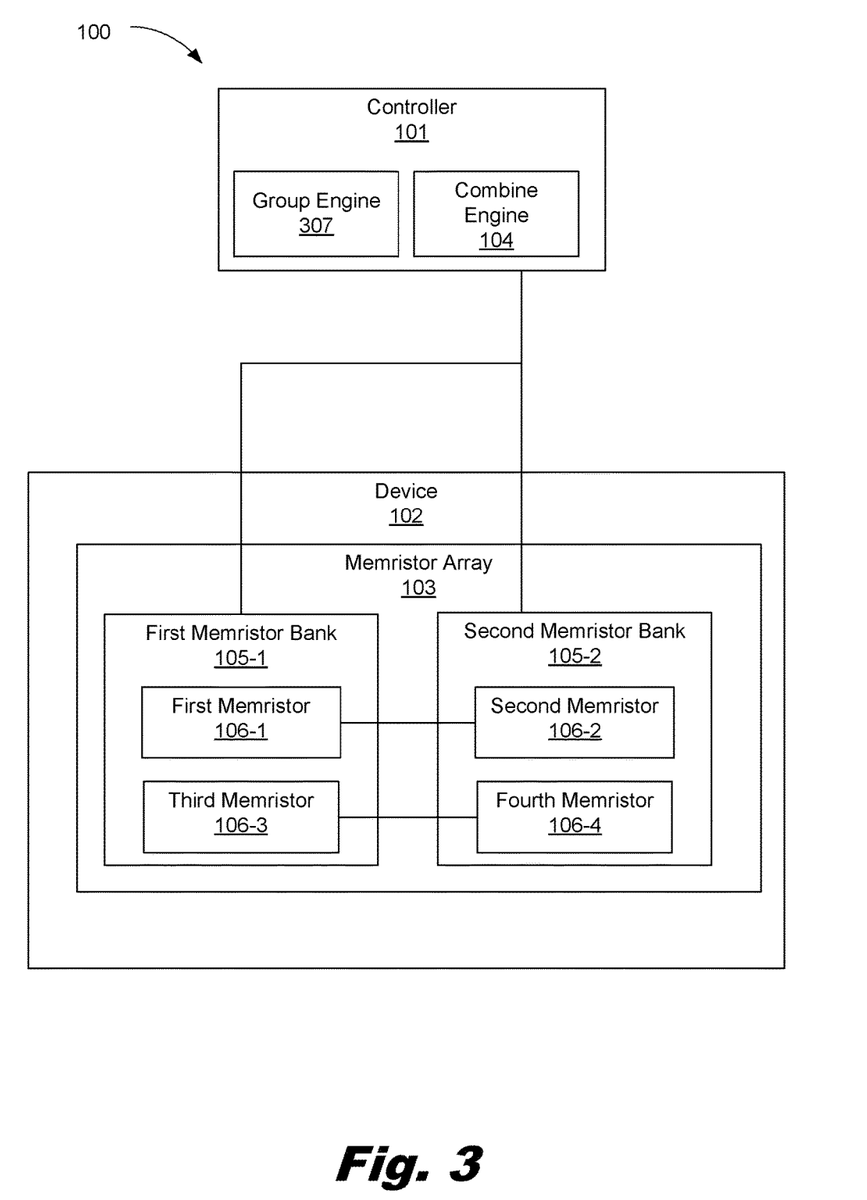
FIG. 3 is a diagram of a system for generating a representative logic indicator of grouped memristors according to one example of the principles described herein.

FIG. 3 is a diagram of a system (100) for generating a representative logic indicator of grouped memristors (106) according to one example of the principles described herein. As described above, the device (102) is coupled to a controller (101) that includes a combine engine (104) to generate a representative logic indicator. The device (102) includes a memristor array (103) having a number of memristors (106) arranged in memristor banks (105). In some examples, the memristors (106-1, 106-3) in the first memristor bank (105-1) may be of the same type. For example, each memristor in the first memristor bank (105-1) may share similar logic indicators, such as a first set of logic indicators. Similarly, each memristor (106-2, 106-4) in the second memristor bank (105-2) may share similar logic indicators, such as a second set of logic indicators that differ from the first set of logic indicators. While FIG. 3 depicts each memristor bank (105) holding memristors (106) having a similar set of logic indicators, in some examples, each memristor bank (105) may hold memristors (106) having different sets of logic indicators. For example, the first memristor bank (105-1) may hold memristors (106) having a first set of resistance levels, for example, $M_A$ as described above, and simultaneously hold memristors (106) having a second set of resistance levels, for example $M_B$.

The controller (101) may also include a group engine (307) that instructs the combine engine (104) which groups of memristors (106) may be combined to form a representative logic indicator. The group engine (307) may receive such an instruction from the controller (101). In some examples, the grouping may be based on an index of the memristor (106). For example, in a cross bar bank each memristor (106) may be designated as $M_{x,y}$ where x indicates a row of the cross bar bank where the memristor (106) is located and y indicates a column of the cross bar bank where the memristor (106) is located. Accordingly, a memristor (106) in the first memristor bank (105-1) having a particular index may be grouped with a memristor (106) in the second memristor bank (105-1) sharing a similar index. In another example, the grouping may be random. Using a random grouping may be beneficial by further increasing the security of data stored in the memristor array (103).

Figure 4:
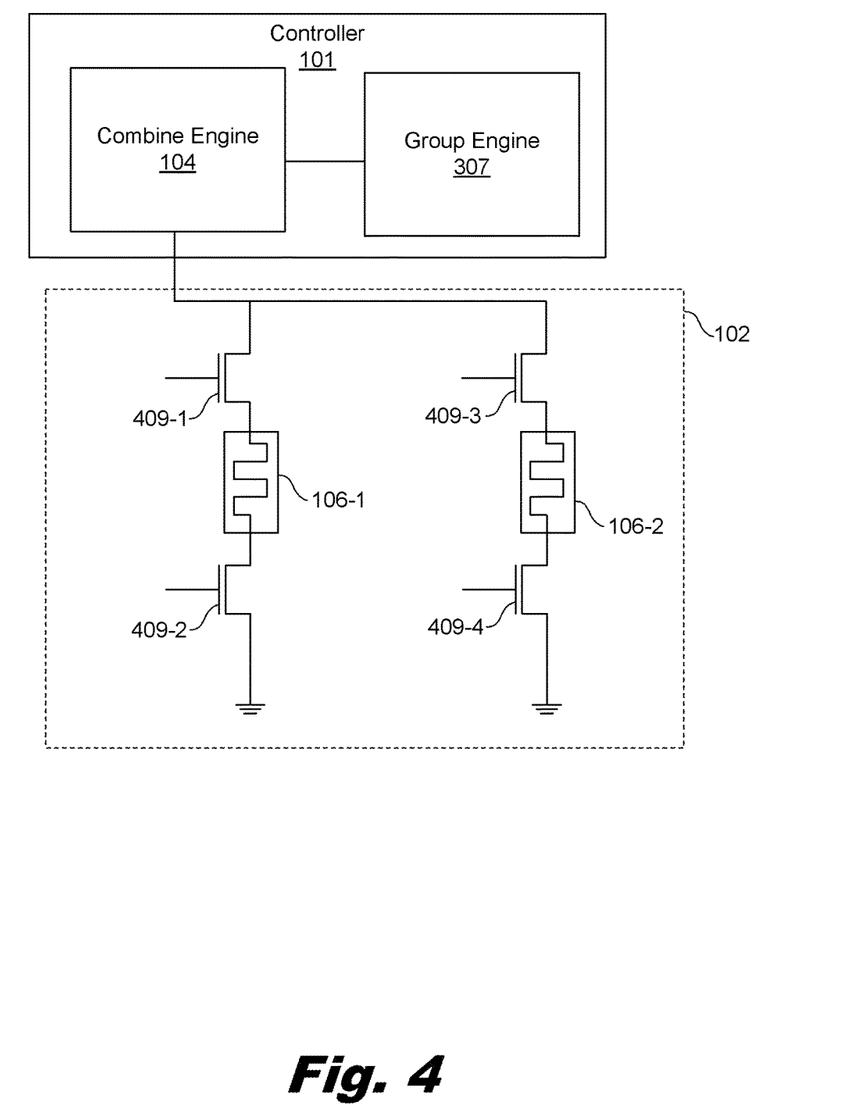
FIG. 4 is a circuit diagram of a device for generating a representative logic indicator of grouped memristors according to one example of the principles described herein.

FIG. 4 is a circuit diagram of a memory device (102) for generating a representative logic indicator of grouped memristors (106) according to one example of the principles described herein. As described above, a first memristor (106-1) may have a first set of logic indicators, or a first set of resistance levels. Similarly, a second memristor (106-2)

may have a second set of logic indicators, or a second set of resistance levels that are different from the first set of resistance levels.

A memristor (106) has a metal-insulator-metal layered structure. More specifically, the memristor (106) includes a bottom electrode (metal), a switching oxide (insulator), and a top electrode (metal). The bottom electrode may be an electrical connection between the memristor (106) and other components. Examples of components that may attach to the bottom electrode include a ground connection, a number of connection pads, a current regulator, a capacitor, a resistor, and metal traces, among other memristor array (FIG. 1, 103) components.

A switching oxide may be disposed on a top surface of the bottom electrode. The switching oxide may be an insulator between the bottom electrode and the top electrode. For example, in a first state, the switching oxide may be insulating such that current does not readily pass from the bottom electrode to the top electrode. Then, during a switching event, the switching oxide may switch to a second state, becoming conductive. In a conductive state, the switching oxide allows a memristor to store information by changing the memristor (106) state.

The memristor (106) also includes a top electrode disposed on a top surface of the switching oxide. As with the bottom electrode, the top electrode may be an electrical connection between the memristor (106) and other components. Examples of components that may attach to the top electrode include a ground connection, a number of connection pads, a current regulator, a capacitor, a resistor, and metal traces, among other memristor array (FIG. 1, 103) components.

As described above, the memristor (106) may share a number of these components with other memristors (106), for example in a cross bar structure. In a cross bar structure a number of columns of traces and a number of rows of traces may be positioned to form a grid. Each intersection of the grid defines a memristor (106). A memristor (106) may be selected by actively selecting a row and a column. An active memristor (106) is a memristor (106) whose row and column are selected. In this example, a first transistor (409-1) may be used to indicate a row of the memristor (106) has been selected and a second transistor (409-2) may be used to indicate a column of the memristor (106) has been selected. Accordingly, a first memristor (106-1) may be selected when both transistors (409-1, 409-2) are closed. Similarly, a second transistor (106-2) may be selected when a third transistor (409-3) and a fourth transistor (409-4) are closed.

A transistor (409) is a device that regulates current and acts as a switch for electronic signals. For example, a transistor (409) may allow current to flow through the memristor (106), which flow changes a state of the memristor (106), i.e., from a low resistance level to a high resistance level or from a high resistance level to a low resistance level. As described above, this change of state allows a memristor (106) to store information. A transistor (409) may include a source, a gate, and a drain. Electrical current flows from the source to the drain based on an applied voltage at the gate. For example, when no voltage is applied at the gate, no current flows between the source and the drain. By comparison, when there is an applied voltage at the gate, current readily flows between the source and the drain.

While FIG. 4 depicts memristors (106) with two transistors (409) as in a cross bar array, the memristors (106) may be used in a one-to-one relationship with a transistor such that a single transistor (409) may be used to select a particular memristor (106). While FIG. 4 depicts the memristors (408) being between transistors (409) other orientations may also be used. For example, the memristor (106) may be below two cascading transistors (409), or may be above two cascading transistors (409).

As described above, the group engine (307) may receive an indication from the controller (FIG. 1, 101) of which memristors (106) from each memristor bank (FIG. 1, 105) should be grouped and communicates this grouping to the combine engine (104). The combine engine (104) then selects the grouped memristors (106) and obtains the resistance levels associated with each memristor (106) be it high resistance or low resistance. The combine engine (104) then generates a representative resistance level that is the resistance level of the first memristor (106-1), the resistance level of the second memristor (106-2), or a combined resistance level of the first memristor (106-1) and the second memristor (106-2).

The systems and methods described herein may have a number of advantages, including: (1) increasing storage density of a memristor array (FIG. 1, 103); (2) increasing data security within the memristor array (FIG. 1, 103); (3) improving memory device (FIG. 1, 102) memory performance; and (4) reducing cost of effective memristor (FIG. 1, 106) fabrication.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processing resources or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A device for generating a representative logic indicator of grouped memristors, comprising:
   a memristor array comprising:
   a number of first memristors having a first set of logic indicators; and
   a number of second memristors having a second set of logic indicators, in which the second set of logic indicators are different than the first set of logic indicators;
   in which each first memristor is grouped with a corresponding second memristor during a memory read operation to:

determine whether to select a logic indicator associated with the first memristor, a logic indicator associated with the second memristor, or a third logic indicator associated with a combination of the first memristor and the second memristor; and generate the representative logic indicator based on the determination.

2. The device of claim 1, in which at least one of the first set of logic indicators and the second sect of logic indicators comprise resistance levels.

3. The device of claim 2, in which:
a first resistance level indicates a first logic level of a memristor; and
a second resistance level indicates a second logic level of a memristor.

4. The device of claim 1, in which the memristor array is divided into a number of memristor banks, in which:
a first memristor bank comprises the number of first memristors; and
a second memristor bank comprises the number of second memristors.

5. The device of claim 4, in which:
the memristor array comprises multiple additional memristors grouped into additional memristor banks; and
each first memristor is additionally grouped with at least one additional memristor from each additional memristor bank.

6. The device of claim 1, wherein at least one of the second set of logic indicators is different than at least one of the first set of logic indicators.

7. The device of claim 4, wherein the memristor banks have a crossbar structure.

8. A system for generating a representative logic indicator of grouped memristors, comprising:
a memristor array comprising:
a first set of memristors having a first set of logic indicators; and
a second set of memristors having a second set of logic indicators, in which the second set of logic indicators are different than the first set of logic indicators;
a group engine to group a first memristor from the first set with a second memristor from the second set; and
a combine engine to:
determine whether to select a logic indicator associated with the first memristor, a logic indicator associated with the second memristor, or a third logic indicator associated with a combination of the first memristor and the second memristor; and
generate the representative logic indicator based on the determination.

9. The system of claim 8, in which the second memristor used to generate the representative logic indicator is based on a grouping with the first memristor.

10. The system of claim 9, in which the group engine receives an indication of the grouping from a controller.

11. The system of claim 9, in which the grouping is random.

12. The system of claim 9, in which the grouping is based on indices of the first memristor and the second memristor.

13. The system of claim 8, in which:
the first set of logic indicators comprises:
a first resistance level indicating a first logic level; and
a second resistance level indicating a second logic level; and
the second set of logic indicators comprises:
a third resistance level indicating the first logic level; and
a fourth resistance level indicating the second logic level;
wherein the third resistance level and the fourth resistance level are different than the first resistance level and the second resistance level.

14. The system of claim 8, wherein memristors having the same set of logic indicators are physically grouped into memristor banks.

15. The system of claim 14, wherein memristors from different memristor banks are grouped together for generation of the representative logic indicator.

16. A method of generating a representative logic indicator of grouped memristors, the method comprising, with a combine engine:
selecting a first memristor from a first set of memristors;
selecting a second memristor from a second set of memristors, in which the second memristor is grouped with the first memristor;
determining whether to select a logic indicator associated with the first memristor, a logic indicator associated with the second memristor, or a third logic indicator associated with a combination of the first memristor and the second memristor; and
generating a representative logic indicator based on the determination.

17. The method of claim 16, in which generating a representative logic indicator comprises combining a logic indicator associated with the first memristor and a logic indicator associated with the second memristor.

18. The method of claim 16, in which the first memristor and the second memristor are connected in parallel.

19. The method of claim 16, further comprising receiving an indication of the grouping of the first memristor and the second memristor.

* * * * *

UNITED STATES PATENT AND TRADEMARK OFFICE
CERTIFICATE OF CORRECTION

PATENT NO. : 10,056,142 B2
APPLICATION NO. : 15/515317
DATED : August 21, 2018
INVENTOR(S) : Ning Ge et al.

Page 1 of 1

It is certified that error appears in the above-identified patent and that said Letters Patent is hereby corrected as shown below:

In the Claims

In Column 13, Line 9, Claim 2, delete "sect" and insert -- set --, therefor.

Signed and Sealed this
Fifth Day of March, 2019

Andrei Iancu
*Director of the United States Patent and Trademark Office*